United States Patent
Deng et al.

(10) Patent No.: US 11,120,886 B2
(45) Date of Patent: Sep. 14, 2021

(54) GATE DRIVING CIRCUIT AND SHIFT REGISTER CONTROLLING METHOD

(71) Applicant: AU Optronics Corporation, Hsin-Chu (TW)

(72) Inventors: Er-Lang Deng, Hsin-Chu (TW);
Yuan-Nan Chiu, Hsin-Chu (TW);
Chih-Yuan Wu, Hsin-Chu (TW);
Yu-Lin Huang, Hsin-Chu (TW);
I-Sheng Lin, Hsin-Chu (TW);
Kuo-Ting Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 52 days.

(21) Appl. No.: 16/679,377

(22) Filed: Nov. 11, 2019

(65) Prior Publication Data

US 2020/0286572 A1    Sep. 10, 2020

(30) Foreign Application Priority Data

Mar. 8, 2019   (TW) .................................. 108107898

(51) Int. Cl.
| | |
|---|---|
| *G11C 19/00* | (2006.01) |
| *G11C 19/28* | (2006.01) |
| *G09G 3/20* | (2006.01) |
| *G09G 3/36* | (2006.01) |

(52) U.S. Cl.
CPC ............ *G11C 19/287* (2013.01); *G09G 3/20* (2013.01); *G09G 3/3677* (2013.01); *G11C 19/28* (2013.01); *G09G 2310/0286* (2013.01); *G09G 2310/061* (2013.01)

(58) Field of Classification Search
None
See application file for complete search history.

(56) References Cited

U.S. PATENT DOCUMENTS

| | | | | |
|---|---|---|---|---|
| 10,283,068 | B1* | 5/2019 | Lv ......................... | G09G 3/3677 |
| 2009/0304138 | A1* | 12/2009 | Tsai ....................... | G11C 19/28 |
| | | | | 377/79 |
| 2014/0078127 | A1* | 3/2014 | Lin ........................ | G09G 3/3677 |
| | | | | 345/211 |
| 2014/0091997 | A1* | 4/2014 | Han ...................... | G09G 3/3611 |
| | | | | 345/92 |
| 2017/0213512 | A1 | 7/2017 | Dai | |
| 2017/0229084 | A1* | 8/2017 | Wang .................... | G09G 3/3696 |

(Continued)

FOREIGN PATENT DOCUMENTS

| | | |
|---|---|---|
| CN | 103500550 A | 1/2014 |
| CN | 104036751 A | 9/2014 |

*Primary Examiner* — Tuan T Lam
(74) *Attorney, Agent, or Firm* — WPAT, PC (57) ABSTRACT

A gate driving circuit comprises a plurality of shift registers coupled in serial. An nth shift register includes a driving circuit, a pull-up circuit and a first auxiliary voltage regulator circuit. The driving circuit is electrically coupled to an output node and a first node. The driving circuit is configured to receive a clock signal and output a gate signal according to the clock signal. The pull-up circuit is electrically coupled to the driving circuit. The first auxiliary voltage regulator circuit is electrically coupled to the pull-up circuit and a second node. The first auxiliary voltage regulator circuit is configured to receive a control signal and the second node corresponding to a second voltage.

23 Claims, 4 Drawing Sheets

(56) References Cited

U.S. PATENT DOCUMENTS

| | | | |
|---|---|---|---|
| 2018/0122322 A1* | 5/2018 | Ji | G11C 19/28 |
| 2018/0190231 A1* | 7/2018 | Shi | H01L 29/78603 |
| 2018/0336847 A1* | 11/2018 | Chen | G09G 3/3406 |
| 2019/0049768 A1* | 2/2019 | Lv | H01L 27/1214 |
| 2019/0073978 A1* | 3/2019 | Shi | G11C 19/28 |
| 2019/0096311 A1* | 3/2019 | Park | G11C 19/28 |
| 2019/0108808 A1* | 4/2019 | Lv | G09G 3/3677 |
| 2019/0287444 A1* | 9/2019 | Tu | G11C 19/28 |
| 2020/0027515 A1* | 1/2020 | Gu | G09G 3/3677 |
| 2020/0082776 A1* | 3/2020 | Shi | G09G 3/3677 |
| 2020/0105216 A1* | 4/2020 | Lv | G09G 3/3677 |
| 2020/0185048 A1* | 6/2020 | Yang | G11C 19/28 |

* cited by examiner

GATE DRIVING CIRCUIT AND SHIFT REGISTER CONTROLLING METHOD

CROSS-REFERENCE TO RELATED APPLICATION

This application claims priority to Taiwanese Application Serial Number 108107898, filed on Mar. 8, 2019, which is herein incorporated by reference.

BACKGROUND

Field of Invention

The present invention relates to a gate driving circuit and shift register controlling method. More particularly, the present invention relates to a gate driving circuit and shift register controlling method for different update rates.

Description of Related Art

Generally, the gate driver of the display device is composed of multiple shift registers connected in serial. Each stage of shift registers is configured to output the gate driving signal of the current stage and enable corresponding pixel line via the gate driving signal, so that each pixels of the pixel line is configured to write the display data.

Currently, high-resolution display panels usually is utilized a higher frame rate in order to maintain display quality to meet the consumer demands, such as the frame rate is 120 Hz. However, the display manufacturers will also need to provide a lower frame rate to satisfy different needs of consumer, such as the frame rate is 60 Hz. Therefore, a gate driving circuit for different frame rate is required.

SUMMARY

The invention provides a gate driving circuit. The gate driving circuit comprises a plurality of shift registers coupled in serial. An nth shift register includes a driving circuit, a pull-up circuit and a first auxiliary voltage regulator circuit. The driving circuit is electrically coupled to an output node and a first node, and the driving circuit is configured to receive a clock signal and output a gate signal according to the clock signal. The pull-up circuit is electrically coupled to the driving circuit. The first auxiliary voltage regulator circuit is electrically coupled to the pull-up circuit and a second node, and the first auxiliary voltage regulator circuit is configured to receive a control signal and the second node corresponding to a second voltage.

The invention provides a shift register controlling method. The shift register controlling method includes operations of: when a shift register circuit operates at a first update rate, a control signal is switched to an enable level, and a first auxiliary voltage regulator circuit maintains voltage of a first node to a second low voltage level; and when the shift register circuit operates at a second update rate, the control signal is switched to a disable level to reduce a leakage current at the first node of the shift register circuit, wherein, the first auxiliary voltage regulator circuit comprises a first transistor and a second transistor.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference labels are used in the drawings and the description to refer to the same or like parts, components, or operations.

Figure 1:
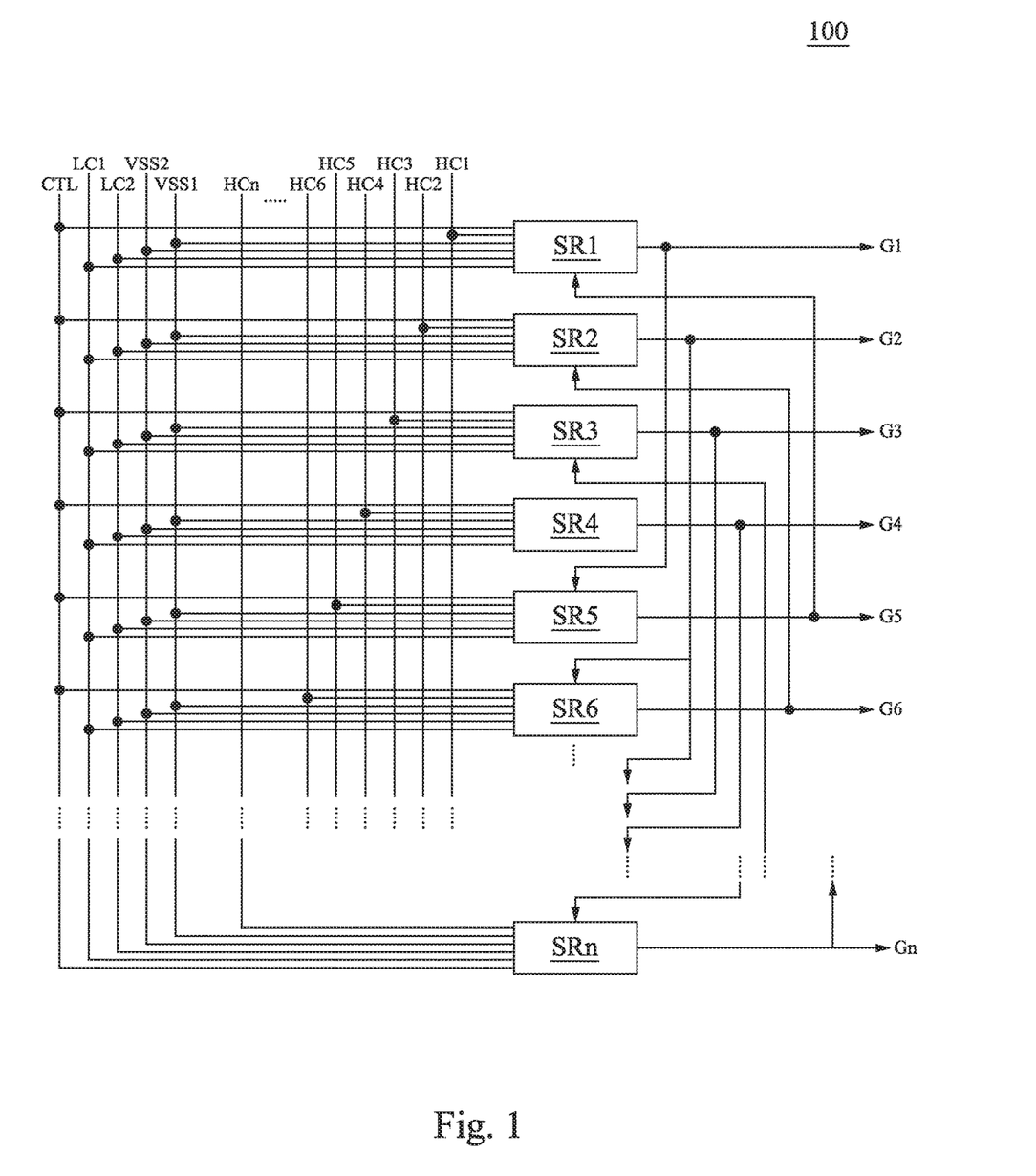
FIG. 1 is a functional block diagram of a gate driving circuit according to one embodiment of the present disclosure.

Reference is made to FIG. 1, which is a functional block diagram of a gate driving circuit 100 according to one embodiment of the present disclosure. As shown in FIG. 1, the gate driving circuit 100 includes multiple shift registers SR1, SR2, SR3, SR4, SR5, SR6, . . . , SRn coupled in serial. Each of shift registers SR1-SRn is configured to output corresponding gate signal G1, G2, G3, G4, G5, G6, . . . , Gn, respectively, and each of shift registers SR1-SRn is electrically coupled to corresponding clock signal HC1, HC2, HC3, HC4, HC5, HC6, . . . , HCn, respectively.

Figure 2:
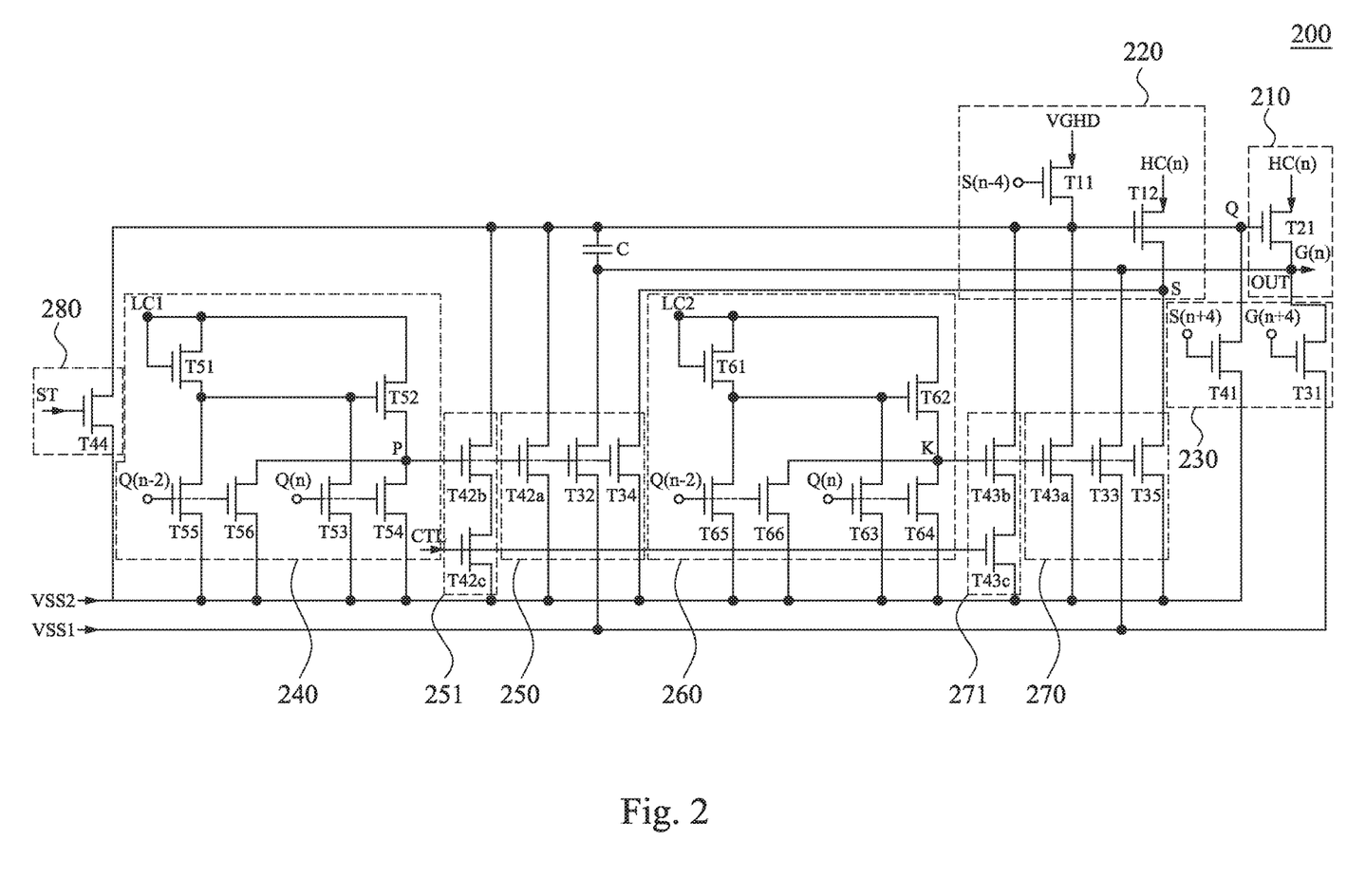
FIG. 2 is a circuit diagram of a shift register according to one embodiment of the present disclosure.

Reference is made to FIG. 2, which is a circuit diagram of a shift register 200 according to one embodiment of the present disclosure. The shift register 200 includes a driving circuit 210, a pull-up circuit 220, a pull-down circuit 230, voltage regulator control circuits 240 and 260, voltage regulator circuits 250 and 270, auxiliary voltage regulator circuits 251 and 271, and a reset circuit 280. The driving circuit 210 is electrically coupled to the output node OUT and the node Q. The pull-up circuit 220 is electrically coupled to the driving circuit 210, the voltage regulator circuits 250 and 270 and the auxiliary voltage regulator circuits 251 and 271. The pull-down circuit 230 is electrically coupled to the driving circuit 210 and the node Q. The voltage regulator circuit 250 is electrically coupled to the node S, the pull-up circuit 220 and the auxiliary voltage regulator circuit 251. The voltage regulator circuit 270 is electrically coupled to the node S, the pull-up circuit 220 and the auxiliary voltage regulator circuit 271. The voltage regulator control circuit 240 is electrically coupled to the auxiliary voltage regulator circuit 251. The voltage regulator control circuit 260 is electrically coupled to the auxiliary voltage regulator circuit 271. The reset circuit 280 is electrically coupled to the pull-up circuit 220.

Afterwards, the driving circuit 210 is configured to receive the clock signal HCn and output the gate signal Gn according to the clock signal HCn. In the embodiment, the shift register is based on the fifth stage (n=5) of shift register, and then the driving circuit 210 is configured to output the gate signal G5 according to the clock signal HC5. The driving circuit 210 includes a transistor T21. The first end of transistor T21 is configured to receive the clock signal HCn. In this case, the first end of transistor T21 is configured to receive the clock signal HC5. The second end of transistor T21 is electrically coupled to the output node OUT. The control end of transistor T21 is electrically coupled to the node Q.

Afterwards, the pull-up circuit 220 is configured to receive the clock signal HCn, a high voltage level VGHD and an (n−4)th transmitting signal S(n−4) of the node S, and raise an nth voltage signal Q(n) of the node Q to a high voltage level. The pull-up circuit 220 includes transistors T11 and T12. The first end of the transistor T11 is configured to receive the high voltage level VGHD. The second end of the transistor T11 is electrically coupled to the node Q. The control end of the transistor T11 is configured to receive to the (n−4)th transmitting signal S(n−4). The first end of the transistor T12 is configured to receive the clock signal HCn. The second end of the transistor T12 is electrically coupled to the node S. The control end of the transistor T12 is electrically coupled to the second end of the transistor T11. In this case, the control end of the transistor T11 is configured to receive to the first stage of transmitting signal S(1), and the first end of the transistor T12 is configured to receive the fifth stage of clock signal HC5.

Afterwards, the pull-down circuit 230 is configured to receive an (n+4)th transmitting signal S(n+4) and an (n+4)th gate signal G(n+4). The pull-down circuit 230 is configured to pull down the gate signal Gn to a low voltage level VSS1 and pull down the voltage signal Q(n) of the node Q to a low voltage level VSS2. The pull-down circuit 230 includes the transistors T31 and T41. The first end of the transistor T31 is electrically coupled to the output node OUT. The second end of the transistor T31 is electrically coupled to the low voltage level VSS1. The control end of the transistor T31 is configured to receive the (n+4)th gate signal G(n+4). The first end of the transistor T41 is electrically coupled to the end Q. The second end of the transistor T41 is electrically coupled to the low voltage level VSS2. The control end of the transistor T41 is configured to receive the (n+4)th transmitting signal S(n+4). In this case, the control end of the transistor T31 is configured to receive to the ninth stage of gate signal G(9), and the control end of the transistor T41 is configured to receive the ninth stage of transmitting signal S(9).

Afterwards, the voltage regulator control circuit 240 is configured to receive an operating signal LC1, the voltage signal Q(n) of the node Q, and a (n−2)th voltage signal Q(n−2) of the node Q, and control the auxiliary voltage regulator circuit 251 and the voltage regulator circuit 250. The voltage regulator control circuit 240 includes transistors T51, T52, T53, T54, T55 and T56. The first end of the transistor T51 is electrically coupled to the control end of the transistor T51. The control end of the transistor T51 is configured to receive the operating signal LC1. The first end of the transistor T52 is electrically coupled to the first end of the transistor T51. The second end of the transistor T52 is electrically coupled to the node P. The control end of the transistor T52 is electrically coupled to the second end of the transistor T51.

Afterwards, the first end of the transistor T53 is electrically coupled to the control end of the transistor T52. The second end of the transistor T53 is electrically coupled to the low voltage level VSS2. The control end of the transistor T53 is configured to receive the voltage signal Q(n) of the node Q. The first end of the transistor T54 is electrically coupled to the node P. The second end of the transistor T54 is electrically coupled to the low voltage level VSS2. The control end of the transistor T54 is configured to receive the voltage signal Q(n) of the node Q. The first end of the transistor T55 is electrically coupled to the second end of the transistor T51. The second end of the transistor T55 is electrically coupled to the low voltage level VSS2. The control end of the transistor T55 is configured to receive the (n−2)th voltage signal Q(n−2) of the node Q. The first end of the transistor T56 is electrically coupled to the node P. The second end of the transistor T56 is electrically coupled to the low voltage level VSS2. The control end of the transistor T56 is configured to receive the (n−2)th voltage signal Q(n−2) of the node Q. In this case, the control end of the transistors T53 and T54 is configured to receive the fifth stage of the voltage signal Q(5), and the control end of the transistors T55 and T56 is configured to receive the third stage of the voltage signal Q(3).

Afterwards, the voltage regulator circuit 250 is configured to receive the voltage signal P(n) of the node P. The voltage regulator circuit 250 is configured to maintain the gate signal Gn to the low voltage level VSS1, and maintain the voltage signal Q(n) of the node Q and an nth transmitting signal S(n) to the low voltage level VSS2. The voltage regulator circuit 250 includes transistors T42a, T32, and T34 and a capacitor C. The first end of the capacitor C is electrically coupled to the node Q, and the second end of the capacitor C is electrically coupled to the output node OUT. The first end of the transistor T42a is electrically coupled to the first end of the capacitor C. The second end of the transistor T42a is electrically coupled to the low voltage level VSS2. The control end of the transistor T42a is configured to receive the voltage signal P(n) of the node P. The first end of the transistor T32 is electrically coupled to the second end of the capacitor C. The second end of the transistor T32 is electrically coupled to the low voltage level VSS1. The control end of the transistor T32 is configured to receive the voltage signal P(n) of the node P. The first end of the transistor T34 is electrically coupled to the node S. The second end of the transistor T34 is electrically coupled to the low voltage level VSS2. The control end of the transistor T34 is configured to receive the voltage signal P(n) of the node P.

Afterwards, the auxiliary voltage regulator circuit 251 is configured to receive a control signal CTL and maintain the voltage signal Q(n) of the node Q and to the low voltage level VSS2. The auxiliary voltage regulator circuit 251 includes transistors T42b and T42c. The first end of the transistor T42b is electrically coupled to the node Q. The control end of the transistor T42b is configured to receive the voltage signal P(n) of the node P. The first end of the transistor T42c is electrically coupled to the second end of the transistor T42b. The second end of the transistor T42c is electrically coupled to the low voltage level VSS2. The control end of the transistor T42c is configured to receive the control signal CTL.

Afterwards, the voltage regulator control circuit 260 is configured to receive an operating signal LC2, the voltage signal Q(n) of the node Q, and the (n−2)th voltage signal Q(n−2) of the node Q, and control the auxiliary voltage regulator circuit 271 and the voltage regulator circuit 270. The voltage regulator control circuit 260 includes transistors T61, T62, T63, T64, T65 and T66. The first end of the transistor T61 is electrically coupled to the control end of the transistor T61. The control end of the transistor T61 is configured to receive the operating signal LC2. The first end of the transistor T62 is electrically coupled to the first end of the transistor T61. The second end of the transistor T62 is electrically coupled to the node K. The control end of the transistor T62 is electrically coupled to the second end of the transistor T61.

Afterwards, the first end of the transistor T63 is electrically coupled to the control end of the transistor T62. The second end of the transistor T63 is electrically coupled to the low voltage level VSS2. The control end of the transistor T63 is configured to receive the voltage signal Q(n) of the node Q. The first end of the transistor T64 is electrically coupled to the node K. The second end of the transistor T64 is electrically coupled to the low voltage level VSS2. The control end of the transistor T64 is configured to receive the voltage signal Q(n) of the node Q. The first end of the transistor T65 is electrically coupled to the second end of the transistor T61. The second end of the transistor T65 is electrically coupled to the low voltage level VSS2. The control end of the transistor T65 is configured to receive the (n−2)th voltage signal Q(n−2) of the node Q. The first end of the transistor T66 is electrically coupled to the node K. The second end of the transistor T66 is electrically coupled to the low voltage level VSS2. The control end of the transistor T66 is configured to receive the (n−2)th voltage signal Q(n−2) of the node Q. In this case, the control end of the transistors T63 and T64 is configured to receive the fifth stage of the voltage signal Q(5), and the control end of the transistors T65 and T66 is configured to receive the third stage of the voltage signal Q(3).

Afterwards, the voltage regulator circuit 270 is configured to receive the voltage signal K(n) of the node K. The voltage regulator circuit 270 is configured to maintain the gate signal Gn to the low voltage level VSS1, and maintain the voltage signal Q(n) of the node Q and an nth transmitting signal S(n) to the low voltage level VSS2. The voltage regulator circuit 270 includes transistors T43a, T33, and T35. The first end of the transistor T43a is electrically coupled to the second end of the transistor T11. The second end of the transistor T43a is electrically coupled to the low voltage level VSS2. The control end of the transistor T43a is configured to receive the voltage signal K(n) of the node K. The first end of the transistor T33 is electrically coupled to the output node OUT. The second end of the transistor T33 is electrically coupled to the low voltage level VSS1. The control end of the transistor T33 is configured to receive the voltage signal K(n) of the node K. The first end of the transistor T35 is electrically coupled to the node S. The second end of the transistor T35 is electrically coupled to the low voltage level VSS2. The control end of the transistor T35 is configured to receive the voltage signal K(n) of the node K.

Afterwards, the auxiliary voltage regulator circuit 271 is configured to receive a control signal CTL and maintain the voltage signal Q(n) of the node Q and to the low voltage level VSS2. The auxiliary voltage regulator circuit 271 includes transistors T43b and T43c. The first end of the transistor T43b is electrically coupled to the node Q. The control end of the transistor T43b is configured to receive the voltage signal K(n) of the node K. The first end of the transistor T43c is electrically coupled to the second end of the transistor T43b. The second end of the transistor T42c is electrically coupled to the low voltage level VSS2. The control end of the transistor T43c is configured to receive the control signal CTL.

Afterwards, the reset circuit 280 is configured to receive a starting signal ST and reset the voltage signal Q(n) of the node Q according to the starting signal ST. The reset circuit 280 includes transistor T44. The first end of the transistor T44 is electrically coupled to the node Q. The second end of the transistor T44 is electrically coupled to the low voltage level VSS2. The control end of the transistor T44 is configured to receive the starting signal ST.

In practice, the transistors described in this disclosure can be implemented by a P-type low temperature polycrystalline germanium film transistor. However, the disclosure is not limited thereto. For example, the transistors can be implemented by a P-type amorphous silicon thin film transistor or other various suitable transistors.

Figure 3:
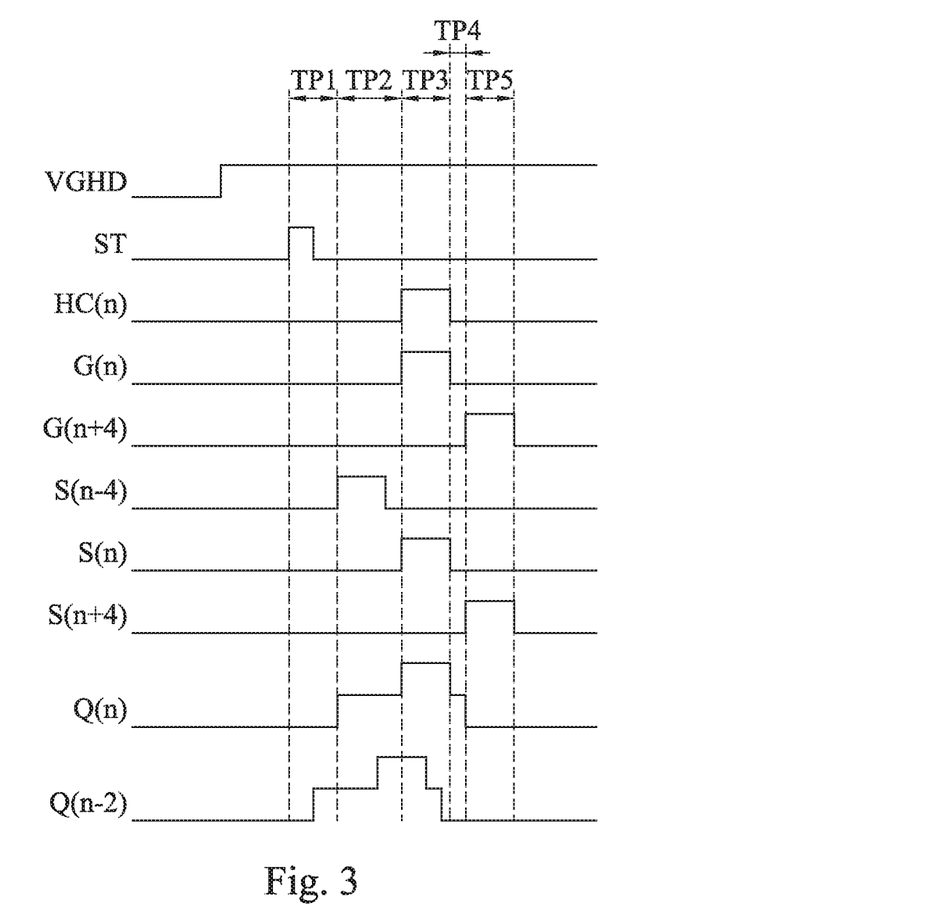
FIG. 3 is a waveform diagram for driving the shift register of FIG. 2.

Reference is made to FIG. 3, which is a waveform diagram for driving the shift register 200 of FIG. 2. The operations of the shift register 200 will be further described in the following by reference to FIGS. 1 to 3. As shown in FIG. 3, in stage TP1, the starting signal ST is at a high voltage level PH and the (n−2)th voltage signal Q(n−2) of the node Q is at an operating voltage V2, and thus the transistors T44, T55, T56, T65 and T66 are both conducted. Therefore, the voltage level of the node Q, P and K are reset at the low voltage level VSS2.

Afterwards, in the stage TP2, the (n−4)th transmitting signal S(n−4) of the node S is at the high voltage level PH and thus the transistors T11 is conducted. The voltage level of node Q is coupled to the first voltage V1. At this time, the nth voltage signal Q(n) of the node Q is at the first voltage V1, and thus the transistors T53, T54, T63, and T64 are both conducted to maintain the control end of the transistors T52, T62, T42a, T42b, T32, T34, T43a, T43b, T33 and T35 at the low voltage level VSS2.

Afterwards, in the stage TP3, because the transistors T11 and T44 are turned off and the nth voltage signal Q(n) is at the first voltage V1, the transistors T12 and T21 is conducted. The clock signal HCn is at the high voltage level PH and thus the transistor T12 transmits the clock signal HCn as the transmitting signal S(n) and the transistor T21 transmits the clock signal HCn as the gate signal Gn. At this time, the nth voltage signal Q(n) is coupled to the operating voltage V2 by the clock signal HCn. Afterwards, in the stage TP4, because the clock signal HCn is at the low voltage level PL, and thus the nth voltage signal Q(n) is at the first voltage V1.

Afterwards, in the stage TP5, because the (n+4)th transmitting signal S(n+4) and the (n+4)th gate signal G(n+4) are at the high voltage level PH and thus the transistors T31 and T41 are both conducted. The transistor T31 pulls down the gate signal Gn to the low voltage level VSS1 and the transistor T41 pulls down the nth voltage signal Q(n) to the low voltage level VSS2. At this time, the nth voltage signal Q(n) of the node Q and the (n−2)th voltage signal Q(n−2) of the node Q are both at the low voltage level VSS2, and thus the transistors T51, T52, T61 and T62 are both conducted by the operating signals LC1 and LC2, so that the transistors T32, T33, T34, T35, T42a, T42b, T43a and T43b are both conducted. The transistors T34 and T35 are configured to maintain the voltage level of the node S at the low voltage level VSS2. The transistors T32 and T33 are configured to maintain the gate signal Gn at the low voltage level VSS1. The transistors T42a and T43a are configured to maintain the voltage level of the node Q at the low voltage level VSS2.

In the embodiment, the control signal CTL is at the high voltage level PH, and thus the transistors T42c and T43c are both conducted. In the stage TP5, the transistors T42c and T43c can support the transistors T42a and T43a maintain the voltage level of the node Q at the low voltage level VSS2. In this case, the control signal CTL can be realized as the high voltage level VGHD.

In another embodiment, the control signal CTL is at the low voltage level PL, and thus the transistors T42c, T43c, T42b and T43b are both turned off. In the stage TP5, because the transistors T42c and T43c are turned off, the leakage current of node Q can be reduced. In this case, the control signal CTL can be realized as the starting signal ST.

Figure 4:
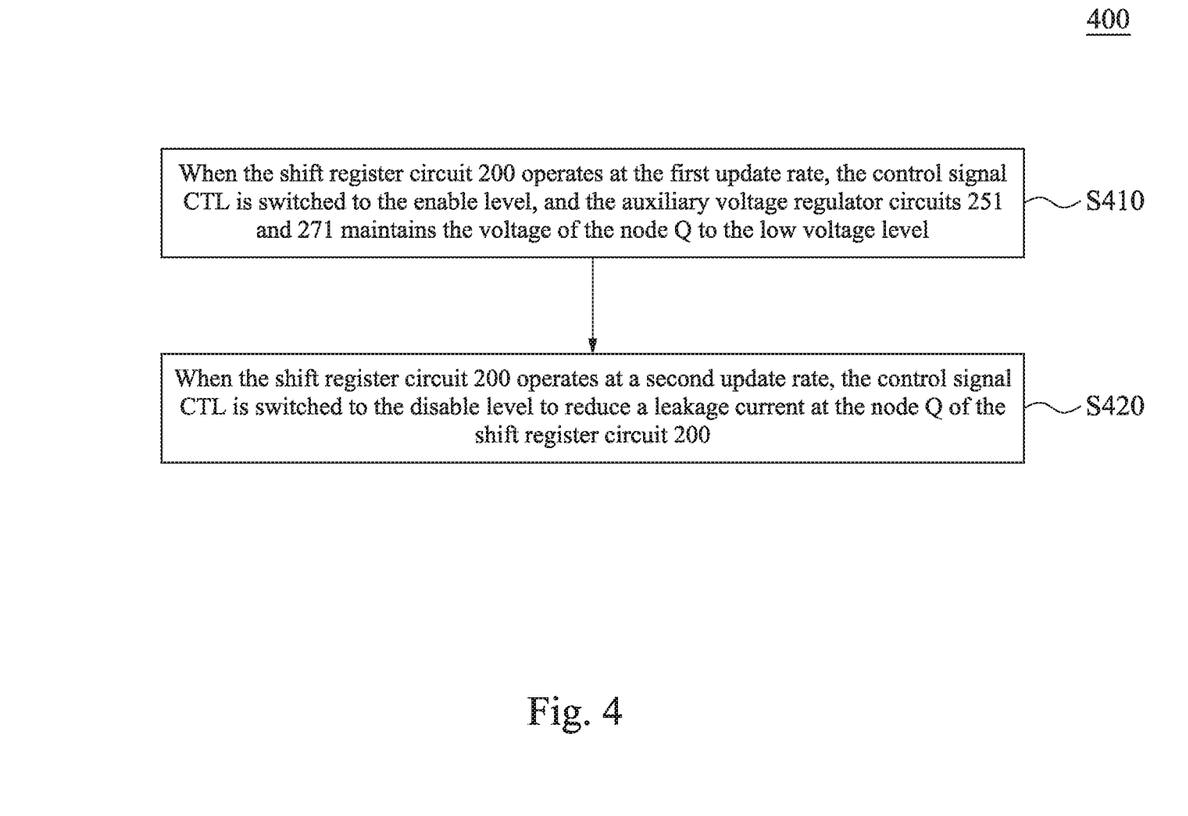
FIG. 4 is a flow diagram illustrating a shift register controlling method according to an embodiment of this disclosure.

Reference is made to FIG. 4, which is a flow diagram illustrating a shift register controlling method 400 according to an embodiment of this disclosure. As shown in FIG. 4, the shift register controlling method 400 firstly executes step S410, when the shift register circuit 200 operates at the first update rate, the control signal CTL is switched to the enable level, and the auxiliary voltage regulator circuits 251 and 271 maintains the voltage of the node Q to the low voltage level. In the embodiment, the first update rate can realized as higher frame rate (e.g. 120 Hz). If the display panel needs to provide the higher frame rate, the control signal CTL can be enabled, the transistors T42b, T43b, T42c and T43c can support the transistors T42a and T43a maintain the voltage level of the node Q at the low voltage level VSS2 to increase the voltage regulation capability of the shift register circuit 200.

Afterwards, the shift register controlling method 400 firstly executes step S420, when the shift register circuit 200 operates at a second update rate, the control signal CTL is switched to the disable level to reduce a leakage current at the node Q of the shift register circuit 200. In the embodiment, the second update rate can realized as lower frame rate (e.g. 60 Hz). If the display panel needs to provide the lower frame rate, the control signal CTL can be disabled. When the transistors T42b and T43b are turned off, the leakage current of node Q can be reduced and the leakage path of the shift register 200 can be decreased.

Based on aforesaid embodiments, this disclosure is capable of increasing the voltage regulation capability of the display panel in higher frame rate and utilizing the new circuit design to reduce the leakage of the transistors at a lower frame rate. In some embodiments, this disclosure is able to allow the display panel to operate at different frame rate.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A gate driving circuit comprises a plurality of shift registers coupled in serial, wherein an nth shift register comprising:
    a driving circuit, electrically coupled to an output node and a first node, is configured to receive a clock signal and output a gate signal according to the clock signal;
    a pull-up circuit, electrically coupled to the driving circuit;
    a first auxiliary voltage regulator circuit, electrically coupled to the pull-up circuit and a second node, and is configured to receive a control signal and a second voltage corresponding to the second node; and
    a second auxiliary voltage regulator circuit, electrically coupled to the pull-up circuit and a third node, and is configured to receive the control signal and a third voltage corresponding to the third node.

2. The gate driving circuit of claim 1, wherein the pull-up circuit is configured to receive the clock signal, a high voltage level and an (n−4)th transmitting signal, and raise an nth first voltage of the first node to an operating voltage.

3. The gate driving circuit of claim 2, wherein the second auxiliary voltage regulator circuit is configured to maintain the nth first voltage to a second low voltage level.

4. The gate driving circuit of claim 2, further comprising:
    a pull-down circuit, electrically coupled to the driving circuit and the first node, is configured to receive an (n+4)th transmitting signal and an (n+4)th gate signal; pull down the gate signal to a first low voltage level and pull down the nth first voltage to a second low voltage level.

5. The gate driving circuit of claim 3, further comprising:
    a first voltage regulator circuit, electrically coupled to a fourth node, the pull-up circuit, and the first auxiliary voltage regulator circuit, and is configured to receive the second voltage corresponding to the second node; maintain the gate signal to a first low voltage level, and maintain the nth first voltage and an nth transmitting signal to the second low voltage level; and
    a second voltage regulator circuit, electrically coupled to the fourth node, the pull-up circuit, and the second auxiliary voltage regulator circuit, and is configured to receive the third voltage corresponding to the third node; maintain the gate signal to the first low voltage level, and maintain the nth first voltage and the nth transmitting signal to the second low voltage level.

6. The gate driving circuit of claim 5, further comprising:
    a first voltage regulator control circuit, electrically coupled to the first auxiliary voltage regulator circuit, and is configured to receive a first operating signal, the nth first voltage, and a (n−2)th first voltage, and control the first auxiliary voltage regulator circuit and the first voltage regulator circuit; and
    a second voltage regulator control circuit, electrically coupled to the second auxiliary voltage regulator circuit, and is configured to receive a second operating signal, the nth first voltage, and a (n−2)th first voltage, and control the second auxiliary voltage regulator circuit and the second voltage regulator circuit.

7. The gate driving circuit of claim 1, further comprising:
    a reset circuit, electrically coupled to the pull-up circuit, and is configured to receive a starting signal and reset an nth first voltage according to the starting signal.

8. The gate driving circuit of claim 1, wherein the driving circuit, further comprising:
    a transistor, comprising a first end, a second end, and a control end, wherein the first end is configured to receive the clock signal; the second end is electrically coupled to the output node, and the control end is electrically coupled to the first node.

9. The gate driving circuit of claim 2, wherein the pull-up circuit, further comprising:
    a first transistor, comprising a first end, a second end, and a first control end, wherein the first end is configured to receive the high voltage level; the second end is electrically coupled to the first node, and the first control end is configured to receive to the (n−4)th transmitting signal; and a second transistor, comprising a third end, a fourth end, and a second control end, wherein the third end is configured to receive the clock signal; the fourth end is electrically coupled to a fourth node, and the second control end is electrically coupled to the second end.

10. The gate driving circuit of claim 1, wherein the first auxiliary voltage regulator circuit, further comprising:

a first transistor, comprising a first end, a second end, and a first control end, wherein the first end is electrically coupled to the first node, and the first control end is electrically coupled to the second node; and a second transistor, comprising a third end, a fourth end, and a second control end, wherein the third end is electrically coupled to the second end; the fourth end is electrically coupled to a second low voltage level, and the second control end is configured to receive the control signal.

11. The gate driving circuit of claim 10, wherein when the control signal switches to an enable level, the second transistor is conducted, and the first transistor and the second transistor maintains an nth first voltage to the second low voltage level.

12. The gate driving circuit of claim 3, wherein the second auxiliary voltage regulator circuit, further comprising:

a first transistor, comprising a first end, a second end, and a first control end, wherein the first end is electrically coupled to the first node, and the first control end is electrically coupled to the third node; and a second transistor, comprising a third end, a fourth end, and a second control end, wherein the third end is electrically coupled to the second end; the fourth end is electrically coupled to the second low voltage level, and the second control end is configured to receive the control signal.

13. The gate driving circuit of claim 12, wherein when the control signal switches to an enable level, the second transistor is conducted, and the first transistor and the second transistor maintains the nth first voltage to the second low voltage level.

14. The gate driving circuit of claim 4, wherein the pull-down circuit, further comprising:

a first transistor, comprising a first end, a second end, and a first control end, wherein the first end is electrically coupled to the output node; the second end is electrically coupled to the first low voltage, and the first control end is configured to receive the (n+4)th gate signal; and a second transistor, comprising a third end, a fourth end, and a second control end, wherein the third end is electrically coupled to the first end; the fourth end is electrically coupled to the second low voltage level, and the second control end is configured to receive the (n+4)th transmitting signal.

15. The gate driving circuit of claim 5, wherein the first voltage regulator circuit, further comprising:

a first transistor, comprising a first end, a second end, and a first control end, wherein the first end is electrically coupled to the fourth node; the second end is electrically coupled to the second low voltage level, and the first control end is electrically coupled to the second node;

a second transistor, comprising a third end, a fourth end, and a second control end, wherein the third end is electrically coupled to the output node; the fourth end is electrically coupled to the first low voltage level, and the second control end is electrically coupled to the second node; and a third transistor, comprising a fifth end, a sixth end, and a third control end, wherein the fifth end is electrically coupled to the first node; the sixth end is electrically coupled to the second low voltage level, and the third control end is electrically coupled to the second node.

16. The gate driving circuit of claim 5, wherein the second voltage regulator circuit, further comprising:

a first transistor, comprising a first end, a second end, and a first control end, wherein the first end is electrically coupled to the fourth node; the second end is electrically coupled to the second low voltage level, and the first control end is electrically coupled to the third node;

a second transistor, comprising a third end, a fourth end, and a second control end, wherein the third end is electrically coupled to the output node; the fourth end is electrically coupled to the first low voltage level, and the second control end is electrically coupled to the third node; and a third transistor, comprising a fifth end, a sixth end, and a third control end, wherein the fifth end is electrically coupled to the first node; the sixth end is electrically coupled to the second low voltage level, and the third control end is electrically coupled to the third node.

17. The gate driving circuit of claim 6, wherein the first voltage regulator control circuit, further comprising:

a first transistor, comprising a first end, a second end, and a first control end, wherein the first end is electrically coupled to the first control end, and the first control end is configured to receive the first operating signal;

a second transistor, comprising a third end, a fourth end, and a second control end, wherein the third end is electrically coupled to the first end; the fourth end is electrically coupled to the second node, and the second control end is electrically coupled to the second end;

a third transistor, comprising a fifth end, a sixth end, and a third control end, wherein the fifth end is electrically coupled to the second control end; the sixth end is electrically coupled to the second low voltage level, and the third control end is configured to receive the nth first voltage;

a fourth transistor, comprising a seventh end, an eighth end, and a fourth control end, wherein the seventh end is electrically coupled to the second node; the eighth end is electrically coupled to the second low voltage level, and the fourth control end is configured to receive the nth first voltage;

a fifth transistor, comprising a ninth end, a tenth end, and a fifth control end, wherein the ninth end is electrically coupled to the second end; the tenth end is electrically coupled to the second low voltage level, and the fifth control end is configured to receive the (n−2)th first voltage; and a sixth transistor, comprising a eleventh end, a twelfth end, and a sixth control end, wherein the eleventh end is electrically coupled to the second node; the twelfth end is electrically coupled to the second low voltage level, and the sixth control end is configured to receive the (n−2)th first voltage.

18. The gate driving circuit of claim 6, wherein the second voltage regulator control circuit, further comprising:

a first transistor, comprising a first end, a second end, and a first control end, wherein the first end is electrically coupled to the first control end, and the first control end is configured to receive the second operating signal;

a second transistor, comprising a third end, a fourth end, and a second control end, wherein the third end is electrically coupled to the first end; the fourth end is electrically coupled to the third node, and the second control end is electrically coupled to the second end;

a third transistor, comprising a fifth end, a sixth end, and a third control end, wherein the fifth end is electrically coupled to the second control end; the sixth end is electrically coupled to the second low voltage level, and the third control end is configured to receive the nth first voltage;

a fourth transistor, comprising a seventh end, an eighth end, and a fourth control end, wherein the seventh end is electrically coupled to the third node; the eighth end is electrically coupled to the second low voltage level, and the fourth control end is configured to receive the nth first voltage;

a fifth transistor, comprising a ninth end, a tenth end, and a fifth control end, wherein the ninth end is electrically coupled to the second end; the tenth end is electrically coupled to the second low voltage level, and the fifth control end is configured to receive the (n−2)th first voltage; and a sixth transistor, comprising a eleventh end, a twelfth end, and a sixth control end, wherein the eleventh end is electrically coupled to the third node; the twelfth end is electrically coupled to the second low voltage level, and the sixth control end is configured to receive the (n−2)th first voltage.

19. The gate driving circuit of claim 7, wherein the reset circuit, further comprising:

a transistor, comprising a first end, a second end, and a control end, wherein the first end is electrically coupled to the first node; the second end is electrically coupled to the second low voltage level, and the control end is configured to receive the starting signal.

20. A shift register controlling method, comprising:

when a shift register circuit operates at a first update rate, a control signal is switched to an enable level, and a first auxiliary voltage regulator circuit maintains voltage of a first node to a second low voltage level; and when the shift register circuit operates at a second update rate, the control signal is switched to a disable level to reduce a leakage current at the first node of the shift register circuit, wherein the first update rate is higher than the second update rate;

wherein, the first auxiliary voltage regulator circuit comprises a first transistor and a second transistor.

21. The shift register controlling method of claim 20, further comprising:

when a shift register circuit operates at the first update rate, the control signal is switched to the enable level, and a second auxiliary voltage regulator circuit maintains voltage of the first node to the second low voltage level, wherein the second auxiliary voltage regulator circuit comprises a third transistor and a fourth transistor.

22. The shift register controlling method of claim 21, wherein when the control signal and a first operating signal switch to the enable level, the first transistor and the second transistor are conducted; when the control signal and a second operating signal switch to the enable level, the third transistor and the fourth transistor are conducted, and the first transistor, the second transistor, the third transistor and the fourth transistor are configured to maintains the first voltage to the second low voltage level.

23. The shift register controlling method of claim 21, wherein when the control signal switches to the disable level, the second transistor and the fourth transistor are turned off.

* * * * *